(12) United States Patent
Kido et al.

(10) Patent No.: US 6,794,278 B2
(45) Date of Patent: Sep. 21, 2004

(54) METHOD FOR PRODUCING ORGANIC THIN-FILM DEVICE BY USE OF FACING-TARGETS-TYPE SPUTTERING APPARATUS

(75) Inventors: Junji Kido, 12-16, Rinsenji 3-chome, Yonezawa-shi, Yamagata (JP), 992-0062; Akira Yokoi, Fujisawa (JP); Sadao Kadokura, Hachioji (JP)

(73) Assignees: Junji Kido, Yonezawa (JP); International Manufacturing and Engineering Services, Co., Ltd., Fujisawa (JP)

( * ) Notice: Subject to any disclaimer, the term of this patent is extended or adjusted under 35 U.S.C. 154(b) by 29 days.

(21) Appl. No.: 10/118,022

(22) Filed: Apr. 9, 2002

(65) Prior Publication Data

US 2002/0173068 A1 Nov. 21, 2002

(30) Foreign Application Priority Data

May 14, 2001 (JP) .................................... 2001-142672

(51) Int. Cl.$^7$ ............................................. H01L 21/20

(52) U.S. Cl. ..................... 438/584; 438/597; 438/99

(58) Field of Search ............................... 438/99, 22, 24, 438/82, 584, 623; 204/298.18, 298.17, 298.06, 298.08–298.09

(56) References Cited

U.S. PATENT DOCUMENTS

| | | | |
|---|---|---|---|
| 5,482,603 A | 1/1996 | Kawashima et al. ... | 204/192.26 |
| 5,500,103 A | 3/1996 | Katou et al. ............ | 204/192.26 |
| 6,156,172 A | 12/2000 | Kadokura .............. | 204/298.26 |
| 2002/0066669 A1 * | 6/2002 | Kadokura | |

FOREIGN PATENT DOCUMENTS

| | | |
|---|---|---|
| EP | 0 273 685 A1 | 7/1988 |
| EP | 0 855 848 A2 | 7/1998 |
| EP | 0 865 089 A2 | 9/1998 |
| EP | 0 865 089 A3 | 4/2002 |

(List continued on next page.)

OTHER PUBLICATIONS

Patent Abstracts of Japan; vol. 1998, No. 05, Apr. 30, 1998 and JP 10–008246A, Jan. 13, 1998.
Patent Abstracts of Japan; vol. 07, No. 143, Jun. 22, 1983 and JP 58 055566A, Apr. 1, 1983.
Patent Abstracts of Japan; vol. 006, No. 266, Dec. 25, 1982 and JP 57 158380A, Sep. 30, 1982.

*Primary Examiner*—Savitri Mulpuri
(74) *Attorney, Agent, or Firm*—Westerman, Hattori, Daniels & Adrian, LLP

(57) ABSTRACT

Disclosed is a method for forming a thin-film layer, such as a metallic film or a transparent conductive film, on a functional organic layer formed from an organic compound, by means of a sputtering method performed at a low discharge voltage and a low gas pressure, without imparting any damage to the surface of the organic layer. The thin-film layer is formed by use of a facing-targets-type sputtering apparatus including a pair of facing targets disposed a predetermined distance away from each other; an electron reflection electrode disposed on the periphery of each target; and magnetic field generation means disposed at the sides of each target. The magnetic field generation means generates a magnetic field extending from one target to the other so as to surround a confinement space provided between the paired targets, as well as a magnetic field having a portion parallel to the surface of each target in the vicinity of a peripheral edge portion of the target. When an AC-DC power containing a DC component and a high-frequency component is supplied as a sputtering power to the apparatus, the thin-film layer can be formed at a lower discharge voltage and a lower gas pressure.

11 Claims, 7 Drawing Sheets

FOREIGN PATENT DOCUMENTS

| | | |
|---|---|---|
| JP | 62-14633 | 4/1987 |
| JP | 63-20303 | 4/1988 |
| JP | 63-20304 | 4/1988 |
| JP | 4-11624 | 3/1992 |
| JP | 5-75827 | 10/1993 |
| JP | 8-250284 | 9/1996 |
| JP | 10-8246 | 1/1998 |
| JP | 10-255987 | 9/1998 |
| JP | 10-270171 | 10/1998 |
| JP | 10-330936 | 12/1998 |

* cited by examiner

METHOD FOR PRODUCING ORGANIC THIN-FILM DEVICE BY USE OF FACING-TARGETS-TYPE SPUTTERING APPARATUS

BACKGROUND OF THE INVENTION

1. Field of the Invention

The present invention relates to a method for producing an organic thin-film device by forming a conductive or insulating thin-film on a functional organic film, and more particularly to a method for producing an organic thin-film device by use of a facing-targets-type sputtering apparatus configured such that a pair of facing targets are disposed a predetermined distance away from each other and such that a magnetic field extending between the targets from one target to the other is generated in such a manner as to laterally surround a space provided between the facing targets (the space is hereinafter called a confinement space), to thereby confine plasma within the confinement space and form a film on a substrate disposed at a position beside the confinement space under vacuum.

2. Description of the Related Art

In recent years, organic electroluminescent devices (hereinafter simply referred to as "organic EL device(s)"), which are a type of organic thin-film device, have become of interest as light-emitting thin-film displays, and extensive studies have been conducted in order to put these thin-film displays into practical use. A typical organic electroluminescent device includes a positive electrode of a transparent electrode constituted by indium-tin oxide (ITO) or a similar substance formed on, for example, a glass or plastic transparent substrate; an organic layer formed from a hole-transporting organic compound such as triphenyldiamine (TPD), the layer being formed on the transparent electrode through a conventional thermal evaporation method; a light-emitting layer formed from a fluorescent substance such as 8-hydroxyquinoline aluminum ($Alq_3$), the layer being formed on the organic layer; and a negative electrode of a metal of small work function such as Mg, the electrode being formed on the light-emitting layer. Such organic EL devices have become of interest, since they provide a considerably high luminance of 100 to 10,000 $cd/m^2$ when operated at a low driving voltage of about 10 V.

Many studies have been performed with an aim to improve properties of such organic EL devices. Particularly, various methods for forming a negative electrode on an organic layer such as a light-emitting layer have been proposed, the method being considered one of key technologies for improving device properties and productivity and for attaining reliable production.

For example, Japanese Laid-Open Patent Publication (kokai) No. H08-250284 discloses a method for forming a negative electrode, through sputtering, on a substrate disposed so as to face a target. The publication describes the following. A negative electrode formed through a typical method of thermal evaporation raises a problem in that an oxide of a metal serving as the raw material of the electrode is generated in the interface between the electrode and an organic layer or in the electrode, to thereby vary electron-injecting properties, resulting in failure to obtain desired device properties. In addition, because of poor adhesion between the electrode and the organic layer, emission intensity is lowered with passage of voltage application time, and the electrode is exfoliated and dissipated, resulting in difficulty in forming a reliable device. In contrast, in the case where a negative electrode thin film is formed through sputtering, adhesion between the electrode and an organic layer is improved as compared with the case where a negative electrode is formed through a thermal evaporation method. Furthermore, an oxide layer formed on the target can be removed under vacuum through pre-sputtering, and water or oxygen adsorbed on the surface of the organic layer can be removed through reverse-sputtering, attaining satisfactory formation of a clean electrode on an organic layer, leading to the production of a reliable organic EL device.

Japanese Laid-Open Patent Publication (kokai) No. H10-255987 discloses a method for producing an organic EL device including an electrode formed by means of a facing-targets-type sputtering method in which a film is formed on a substrate disposed at a position beside a space provided between a pair of facing targets. In the course of production of the organic EL device, a negative electrode is formed on an organic film of the organic EL device by use of a facing-targets-type sputtering apparatus. The apparatus includes a pair of parallel facing targets disposed a predetermined distance away from each other; magnetic-field generation means which generates a magnetic field in a direction substantially perpendicular to the targets; and a shield disposed so as to cover a portion of each target other than the facing surface. In the apparatus, a substrate is disposed at a position beside a space provided between the facing targets, power is applied between the target and the shield, and the thus-generated plasma is confined within the space, to thereby form a film on the substrate.

The publication describes the following. In the case of conventional sputtering method such as the aforementioned magnetron-type sputtering method, in which a substrate and a target are disposed so as to face each other, secondary electrons generated from the surface of the target and sputtered particles of high kinetic energy; specifically, large amounts of secondary electrons and ionized sputtered particles, impinge on an organic layer, to thereby physically break the organic layer. As a result, the electrostatic breakdown voltage of an organic EL device is lowered, and application of voltage between negative and positive electrodes may cause leakage of current. Alternatively, the device may fail to function, as a result of breakage associated with an increase in temperature. Furthermore, driving voltage increases and luminance decreases, to thereby deteriorate EL properties.

In contrast, in the aforementioned facing-targets-type sputtering apparatus, a plasma generation region and a film formation region are completely separated from each other, and a film is formed in a plasma-free-like state. Therefore, a substrate is substantially not exposed to plasma, and film formation is carried out such that an organic layer and a film deposited on the layer are not damaged by high-energy particles. As a result, problems arising from the aforementioned conventional sputtering method are solved, and the resultant organic EL device has a high luminance at an initial stage, and the time until the luminance becomes half increases. Furthermore, the device has very small amounts of dark spots at an initial stage, and generation and growth of dark spots after operation are reduced.

A conventional facing-targets-type sputtering apparatus will next be described. The sputtering apparatus is disclosed in Japanese Publication of Examined Patent Application (kokoku) Nos. S63-20303, S63-20304, and S62-14633, and has the following basic configuration as shown in FIG. 1. A pair of targets 110a and 110b are disposed a predetermined distance away from each other within a vacuum chamber 10 having a chamber wall 11, thereby defining a confinement space 120 therebetween. Permanent magnets 130a and 130b serving as magnetic-field generation means are disposed behind the corresponding targets 110a and 110b in order to generate a magnetic field which extends in a direction perpendicular to the targets 110a and 110b and whose flux uniformly surrounds the confinement space 120. A substrate holder 21 disposed at a position beside the confinement space 120 holds a substrate 20 such that the substrate 20 faces the confinement space 120. Reference numerals 140a and 140b represent shields for protecting from sputtering portions of target units 100a and 100b other than the front surfaces of the targets 110a and 110b.

After the vacuum chamber 10 is evacuated through an evacuation port 30 by means of an unillustrated evacuation system, a sputtering gas, such as argon, is introduced into the vacuum chamber 10 through a gas inlet 40 by means of an unillustrated gas introduction means. As shown in FIG. 1, a DC sputtering power supply 50 supplies sputtering power to the apparatus while the shields 140a and 140b; i.e., the vacuum chamber 10, serve as an anode (ground) and the targets 110a and 110b serve as a cathode. Thus, sputtering plasma is generated while being confined within the confinement space 120 by means of the perpendicular magnetic field. The sputtering plasma effects sputtering of the targets 110a and 110b, thereby forming on the substrate 20 a thin film whose composition corresponds to that of the targets 110a and 110b.

In use of the apparatus, since the magnetic field extends in the direction extending between the targets 110a and 110b; i.e., perpendicular to the targets 110a and 110b, high-energy electrons are confined within the confinement space 120 so as to generate sputtering plasma. The sputtering plasma accelerates ionization of the sputtering gas, thereby increasing a sputtering rate and thus forming a film at high rate. In contrast to a typical conventional magnetron-type sputtering method, in which a substrate is disposed in opposition to a target, the substrate 20 is disposed at a position beside the targets 110a and 110b. Accordingly, ions and electrons impinging on the substrate 20 are greatly reduced. Also, thermal radiation from the targets 110a and 110b to the substrate 20 is low, so that an increase in substrate temperature becomes small. Thus, a film can be formed at low temperature.

However, the present inventors have found that, in the case of an organic EL device including a negative electrode formed by means of the method disclosed in Japanese Laid-Open Patent Publication (kokai) No. H10-255987 and by use of the conventional facing-targets-type sputtering apparatus shown in FIG. 1, in order to obtain emission having a certain luminance at an initial stage, a higher voltage is required as compared with the case of an organic EL device including a negative electrode formed through a conventional thermal evaporation method.

Meanwhile, in order to put organic EL devices into practical use, there has been demand for a method for further improving emission properties of organic EL devices and for mass-producing organic EL devices reliably.

The aforementioned driving voltage increase is attributed to the below-described deterioration of properties of a functional organic layer, such as electron-transporting property and light-emitting property, during formation of an electrode. The driving voltage increase is a common problem among organic thin-film devices having a structure including a functional organic layer and a thin-film layer such as an electrode formed on the organic layer. Also, the driving voltage increase becomes a problem when organic thin-film devices such as organic EL devices, organic FET devices, and organic solar batteries are put into practical use.

SUMMARY OF THE INVENTION

An object of the present invention is to provide a method for producing an organic thin-film device, wherein a thin-film layer is formed on a functional organic layer without imparting substantially damage to the functional organic layer.

Another object of the present invention is to provide a method for forming a high-quality thin-film layer such as a metallic film on a functional organic layer.

Still another object of the present invention is to provide an organic EL device which emits light of a certain luminance at a lower driving voltage.

Still another object of the present invention is to provide an organic EL device which emits light of higher luminance.

Still another object of the present invention is to provide a method for producing an organic EL device reliably exhibiting excellent emission properties at high productivity.

In order to achieve the above objects, the present invention provides a method for producing an organic thin-film device comprising a functional organic layer formed from an organic compound and a thin-film layer laminated on the organic layer, which method comprises forming the thin-film layer, by use of a facing-targets-type sputtering apparatus including a pair of facing targets disposed a predetermined distance away from each other; an electron reflection electrode disposed at the periphery of each target so as to face a confinement space provided between the paired targets; and magnetic field generation means disposed at the lateral sides of each target, wherein the magnetic field generation means generates a magnetic field extending from one target to the other so as to surround a confinement space provided between the paired targets, as well as a magnetic field having a portion parallel to the surface of each target in the vicinity of a peripheral edge portion of the target.

The present invention has been accomplished as described below. The aforementioned driving voltage increase in the organic EL devices produced through the method described in Japanese Laid-Open Patent Publication (kokai) No. H10-255987 by use of the conventional facing-targets-type sputtering apparatus is considered to be attributed to an insulating layer; i.e., a property-deteriorating layer which is generated in the interface between the organic layer and the negative electrode. The insulating layer is generated for the reasons described below. The atomic bonding energy between atoms constituting organic substances contained in the organic layer provided below the negative electrode is as follows: C—C bonding energy (348 kJ/mol) and C—H bonding energy (412 kJ/mol). Since 96.5 kJ/mol corresponds to 1 eV, such a bonding energy becomes several eV.

Meanwhile, in the conventional facing-targets-type sputtering method, since discharge voltage is high during film formation, recoiled argon and electrons having an energy several times the aforementioned bonding energy impinge on the organic layer, and the recoiled argon and electrons break organic compounds in the surface of the organic layer, resulting in formation of an insulating film in the interface between the organic layer and the negative electrode.

The present inventors have performed extensive studies, and have found that, as described below, the objects of the present invention can be achieved by use of the facing-targets-type sputtering apparatus having the aforementioned structure. The present invention has been accomplished on the basis of this finding.

Specifically, the present inventors have found that, in the facing-targets-type sputtering apparatus—in which a magnetic field parallel to facing targets is generated around the targets, while a magnetic field perpendicular to the facing targets is generated as in the case of the aforementioned conventional facing-targets-type sputtering apparatus, and electron reflection electrodes are provided on the periphery of each target, to thereby confine plasma in a confinement space provided between the targets—plasma is more effectively confined in the confinement space and a film is formed at lower gas pressure and discharge voltage as compared with the case of the conventional sputtering apparatus in which merely a perpendicular magnetic field is generated. Also, the present inventors have found that, when a negative electrode is formed at low gas pressure and discharge voltage, as described below in Experiments, the resultant organic EL device exhibits initial emission properties such as driving voltage and luminance similar to those with a negative electrode formed through a conventional thermal evaporation method, and that the maximum luminance of the EL device is improved considerably; i.e., the maximum luminance becomes three to five times that of an organic EL device produced through the thermal evaporation method.

Therefore, a large current can be supplied, in a film thickness direction, to a negative electrode formed by use of the sputtering apparatus of the present invention, whereas such a large current cannot be supplied to a negative electrode formed through the conventional thermal evaporation method, due to damage imparted to an organic layer lying under the electrode. According to the present invention, a thin film having no defects can be formed on an organic thin film without imparting any damage to the surface and inside of the organic thin film.

The reasons why such excellent emission properties and thin film are obtained by the present invention have not been elucidated, but are considered to be as follows. Since film formation can be performed at low gas pressure and discharge voltage in the facing-targets-type sputtering apparatus of the present invention unlike the case of the conventional facing-targets-type sputtering apparatus, the kinetic energy of sputtering particles used for film formation can be regulated at such a level that the particles can be diffused on the surface of a deposition film so as not to cause any lattice defect, and the number of sputtering gas particles and electrons which impinge on the organic layer serving as a substrate, the particles and electrons having a high energy so as to break bonding of atoms constituting an organic compound comprising the organic layer, can be regulated to such a level that substantially no problems arise. Therefore, imparting of damage to the surface of the organic layer can be prevented, and films exhibiting excellent durability and having no defects can be continuously formed on the organic layer. In other words, according to the present invention, a thin film having high quality can be formed on the organic layer without imparting any damage to the organic layer, since sputtered particles used for film formation have the kinetic energy of a level that the particles can be diffused on the surface of a deposition film so as not to cause any lattice defect.

In the present invention, the gas pressure and discharge voltage are preferably determined such that an excellent electrode is formed on an organic layer so as not to impart any damage to an organic compound comprising the organic layer. Preferably, the gas pressure and discharge voltage are determined on the basis of experiments, since they are varied with the type of the organic compound and the material of the electrode. Specifically, as described below in Experiments in which organic EL devices are produced, the gas pressure is preferably 0.3 Pa or less, and the discharge voltage is preferably 300 V (absolute value) or less. The reason for this is because, when the gas pressure is higher than 0.3 Pa, the amount of a sputtering gas component such as argon contained in a thin film increases, resulting in deterioration of the quality of the thin film, and when the discharge voltage is higher than 300 V, the energy of recoiled argon and $\gamma$-electrons, which are generated during film formation, increases, and thus an organic film tends to be damaged. However, a very low discharge voltage is not preferable, from the viewpoint of ensuring sputtered particles used for film formation have the kinetic energy of a level that any lattice defect is not caused in the film. Therefore, the discharge voltage is preferably about 100 V (absolute value) or more.

In the facing-targets-type sputtering apparatus employed in the present invention, preferably, as has been proposed by one of the present inventors in Japanese Patent Application No. 2000-36965 (U.S. patent application Ser. No. 09/998,235), sputtering is carried out by use of AC-DC power containing a DC component and a high-frequency component, since a discharge voltage can be regulated over the wide range, particularly in the range of low voltage, as compared with the case of a conventional sputtering apparatus, and a discharge voltage suitable for various materials can be determined within a range such that a functional organic layer sustains substantially no damage.

It has been confirmed that, in the conventional facing-targets-type sputtering apparatus described in Japanese Laid-Open Patent Publication (kokai) No. H10-255987, even when AC-DC power containing a DC component and a high-frequency component is supplied, a discharge voltage cannot be reduced, and plasma is not confined between facing targets and is spread over a substrate, resulting in damage to an organic layer.

Although the present invention will next be described in detail with reference to embodiments in which the invention is applied to organic EL devices, it is apparent that the invention is not limited to the embodiments and may be applied to various organic thin-film devices having a structure including a functional organic layer and a thin-film layer formed on the organic layer.

As used herein, the term "functional organic layer" refers to a functional layer which contains an organic compound exhibiting predetermined properties, specifically electromagnetic properties such as electron-transporting property, hole-transporting property, light-emitting property, conductivity, magnetic property, and insulating property, and which itself exhibits such predetermined properties. No particular limitation is imposed on the thin-film layer to which the present invention can be applied, the layer being formed on the functional organic layer. The present invention may be applied to an electrode layer of a metal or a conductive oxide which must be formed through sputtering in consideration of the quality of the layer; or may be applied to an inorganic layer such as an insulating protective layer of a metal oxide or a metal nitride. Of these, the present invention is preferably applied to an electrode layer necessary for a good interface which is bonded to the functional organic layer.

Specific examples of the aforementioned organic thin-film devices include organic EL devices, organic solar battery devices, organic rectifier devices, and organic field effect transistors (FETs). The structures of an organic solar battery device, an organic rectifier device, and organic FET are briefly described below.

An organic solar battery device has a structure such that two electrodes (at least one of the electrodes is a transparent electrode) sandwich an organic thin film having a two-layer structure including an electron-transporting layer and a charge-generating layer formed from dye molecules which absorb visible rays to thereby generate electrons and holes, or an organic thin film having a structure of three or more layers including a hole-transporting layer, an electron-transporting layer, and the aforementioned charge-generating layer provided between the hole-transporting layer and electron-transporting layer. In the device having the two-layer structure or the structure of three or more layers, an important feature is to prevent recombination of generated electrons and holes to thereby allow electron-hole separation to proceed effectively, in order to increase photoelectric conversion efficiency.

An organic rectifier device has a structure in which two electrodes sandwich an organic thin film including a hole-transporting layer (p-type semiconductor) and an electron-transporting layer (n-type semiconductor). The device exerts rectification effect, since a barrier is formed in the junction portion between the hole-transporting layer and electron-transporting layer, similar to the case of the pn junction of an inorganic semiconductor. When the hole-transporting layer and electron-transporting layer are doped with small amounts of acceptor molecules and donor molecules, respectively, current density can be increased.

An organic FET is a gate-insulated transistor including an organic semiconductor such as a polythiophene derivative. In the FET, source and drain electrodes must be formed on the organic semiconductor. In the case where the FET includes a p-type organic semiconductor, when a negative voltage is applied to a gate electrode, holes are accumulated in the interface between the insulator and the semiconductor, and electrical conductivity increases in the vicinity of the interface. When a voltage lower than that applied to the source electrode is applied to the drain electrode, the thus-accumulated holes are injected from the source electrode into the semiconductor, to thereby cause current to flow.

The foregoing and other objects of the present invention, together with its novel features, will become more apparent from the following detailed description and with reference to the accompanying drawings.

DESCRIPTION OF THE PREFERRED EMBODIMENTS

The invention will be now described herein with reference to illustrative embodiments. Those skilled in the art will recognize that many alternative embodiments can be accomplished by use of the teachings of the present invention and that the invention is not limited to the embodiments illustrated for explanatory purposes.

First Embodiment

Figure 1:
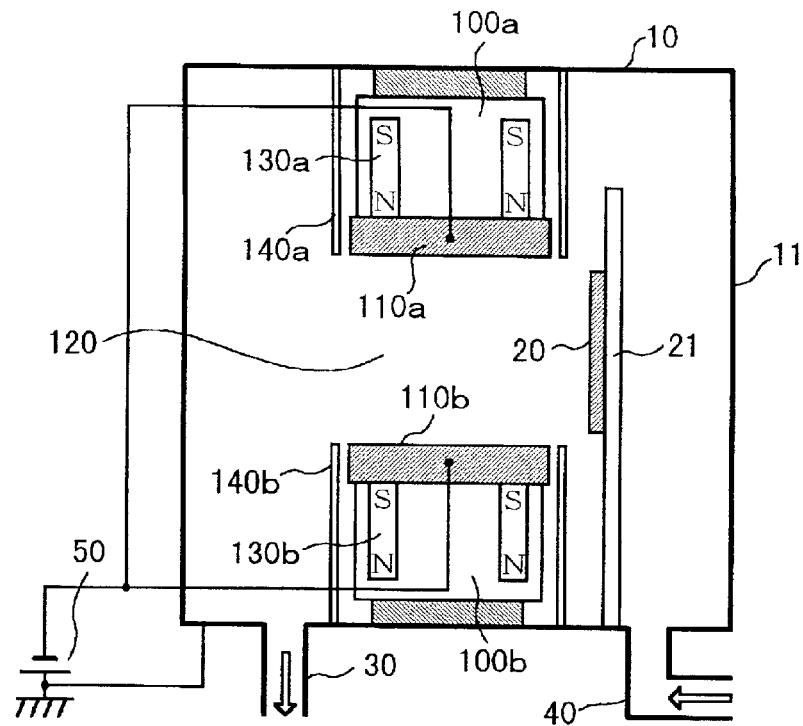
FIG. 1 is a vertical sectional view showing the configuration of a conventional facing-targets-type sputtering apparatus.

A facing-targets-type sputtering apparatus employed in a first embodiment has a basic configuration which is shown in FIG. 1 and is disclosed in Japanese Publication of Examined Patent Application (kokoku) Nos. H04-11624 and H05-75827 and Japanese Laid-Open Patent Publication (kokai) Nos. H10-8246 and H10-330936 (U.S. Pat. No. 6,156,172), and includes electron reflection means provided around the periphery of facing targets such that a magnetic field having a portion parallel to the surface of each of the targets is generated on the vicinity of the surface of the peripheral portion of the target.

Figure 2A:
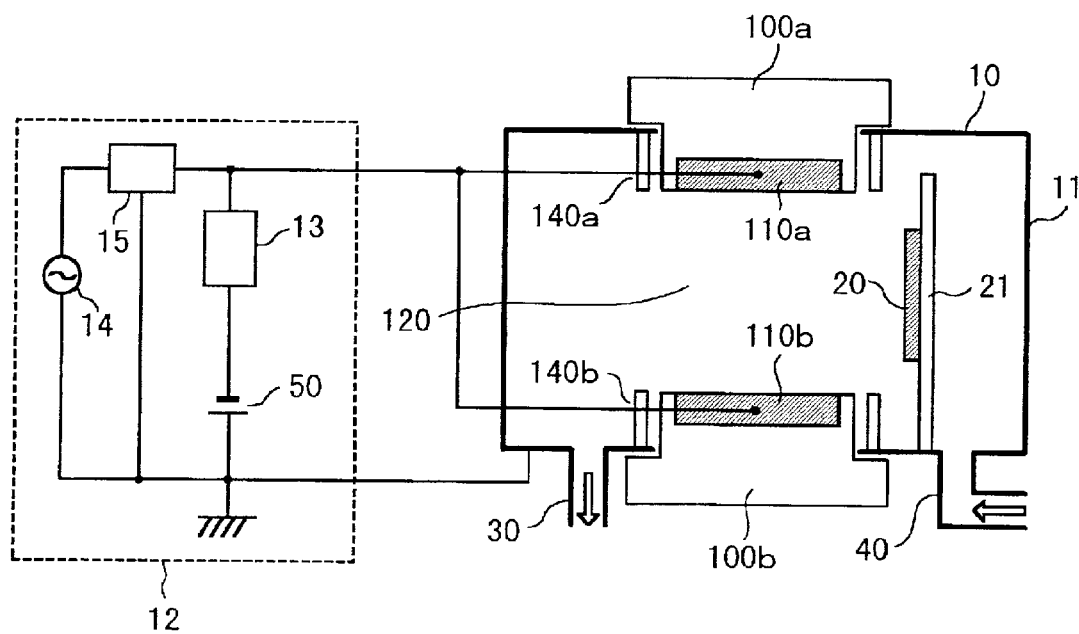
FIG. 2A is a vertical sectional view showing a facing-targets-type sputtering apparatus employed in a first embodiment of the present invention.

FIG. 2A is a schematic vertical sectional view showing the first embodiment of the facing-targets-type sputtering apparatus of the present invention. The present embodiment differs from the conventional apparatus of FIG. 1 in the configuration of target units 100a and 100b and in power supply—the present embodiment uses a DC power supply and a high-frequency power supply for applying power between a vacuum chamber 10 and targets 110a and 110b, whereas the conventional apparatus uses only a DC power supply. Features common between the present embodiment and the conventional apparatus are denoted by common reference numerals, and repeated description is omitted. According to the present embodiment, openings are formed in two corresponding facing chamber walls 11 of a vacuum chamber 10. Target units 100a and 100b are mounted to cover the openings (the configuration of the target units 100a and 100b will be described later in detail). A power unit 12 applies power between the vacuum chamber 10 and targets 110a, 110b. Specifically, a DC power supply 50 supplies DC power through a low-pass filter 13, and a high-frequency power supply 14 supplies high-frequency power through a matching circuit 15.

Figure 2B:
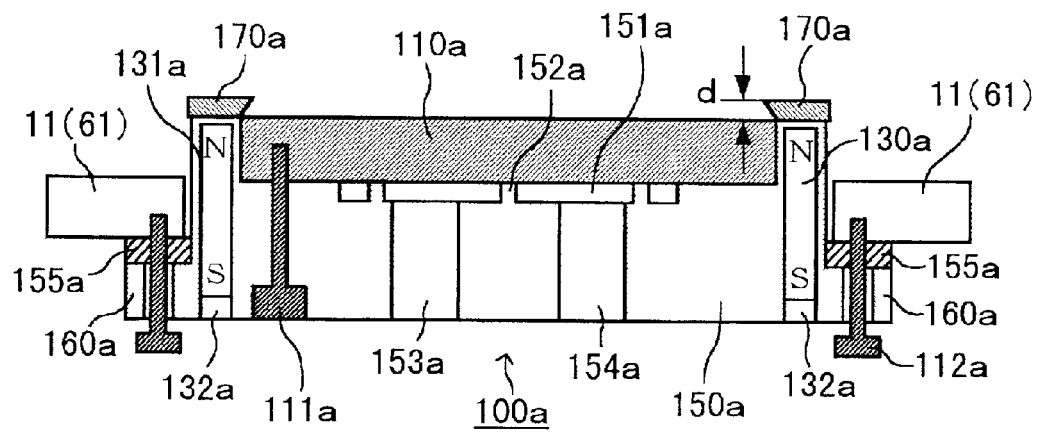
FIG. 2B is a vertical sectional view showing the configuration of a target unit of the sputtering apparatus shown in FIG. 2A.

The target units 100a and 100b of the facing-targets arrangement are configured as shown in FIG. 2B. The target units 100a and 100b assume the same configuration, except that, as shown in FIG. 1, the N and S magnetic poles of magnetic field generation means are arranged in reverse. The following description covers only the target unit 100a shown in FIG. 2B. The configuration of the target unit 100a is similar to that disclosed by one of the present inventors in Japanese Laid-open Patent Publication (kokai) No. H10-330936 (U.S. Pat. No. 6,156,172). The publication calls a counterpart of the present invention's electron reflection means an electron trap plate while focusing attention on the action of trapping electrons in a confinement space rather than the action of reflecting electrons back into the confinement space.

A target 110a is removably mounted on the front surface of a cooling block 150a serving as a support member, by means of bolts 111a arranged at certain intervals in a peripheral region of the cooling block 150a. The target 110a is generally formed in a circular or square shape. The shape of a target reception portion of the cooling block 150a is determined accordingly. A recess is formed on the front surface of the cooling block 150a and divided by a partition wall 152a into a cooling groove 151a, thereby forming a cooling jacket for directly cooling the mounted target 110a from behind, as shown in FIG. 2B. Thus, cooling can be carried out with high efficiency, thereby allowing high-rate film formation. The cooling block 150a; i.e., the target unit 100a, is removably mounted on the chamber wall 11; specifically, a mounting section 160a of the cooling block 150a is mounted on the chamber wall 11 or the below-described support frame 61 via a packing 155a made of an electrically insulating material, by means of bolts 112 a arranged at certain intervals.

The cooling block 150a is configured in the following manner. A magnet housing section 131a for housing a permanent magnet 130a of the magnetic field generation means is formed along the periphery of the target 110a in a surrounding condition. Plate-like electron reflection means 170a is provided on the front end face of the magnet housing section 131a while projecting into the interior of the vacuum chamber 10 by a predetermined effective length d as measured from the front surface of the target 110a. In the case of the target 110a made of a magnetic material, the electron reflection means 170a is made of a magnetic material and serves as a magnetic pole end of the magnetic field generation means, thereby generating a magnetic field which has a portion parallel to the surface of the target 110a and extends from the electron reflection means 170a, via the surface of a peripheral edge portion of the target 110a, to the other magnetic pole of the magnetic field generation means. In the case of the target 110a made of a non-magnetic material, even when the electron reflection means 170a is made of a nonmagnetic material, there is generated a magnetic field which has a portion parallel to the surface of the target 110a and extends from the electron reflection means 170a, via the surface of a peripheral edge portion of the target 110a, to the other magnetic pole of the magnetic field generation means.

As shown in FIG. 2B, the magnet housing section 131a is configured in the following manner. A plurality of bores having a predetermined depth are formed in the cooling block 150a while being arranged at predetermined intervals and opening to the exterior of the vacuum chamber 10 in order to allow removable insertion of the permanent magnets 130a of the magnetic field generation means thereinto. The magnetic field generation means is configured in the following manner. A plurality of rod-like permanent magnets 130a are inserted into the corresponding bores of the magnet housing section 131a and fixed in place by means of the corresponding retainers 132a while being oriented as shown in FIG. 2B, thereby being arranged at predetermined intervals around the target 110a.

The cooling block 150a having a unitary structure which has the magnet housing section 131a and the mounting section 160a is manufactured in the following manner. A block of a structural material having good thermal conductivity, such as metal—in the present embodiment, an aluminum block—is machined into a shape having the cross section of FIG. 2B by use of a numerically controlled machining machine. Through-bores for the bolts 111a and 112a are drilled in the block at predetermined positions at predetermined intervals. Bores serving as the magnet housing section 131a for housing the permanent magnets 130a of the magnetic field generation means are drilled, at the bottom side of the block, to a predetermined depth in a peripheral edge portion of the block at predetermined positions arranged at predetermined intervals. Thus is obtained a block of a seamless unitary structure. The structure establishes complete isolation between the interior and the exterior of the vacuum chamber 10 to thereby prevent entry of the ambient atmosphere into the vacuum chamber 10. Since cooling water flows through the cooling groove 151a of the cooling block 150a via cooling water passes 153a and 154a, the permanent magnets 130a housed in the magnet housing section 131a can be sufficiently cooled through merely thermal conduction.

As mentioned previously, the electron reflection means 170a—adapted to reflect approaching electrons back into the confinement space for trapping the electrons within the space—is provided on an end of the magnet housing section 131a facing the interior of the vacuum chamber 10, in such a manner as to surround the target 110a. When the composition of a film to be formed is required to be controlled strictly, the electron reflection means 170a is preferably made of the same material as that of the target 110a, since, in such a preferred mode, even when the electron reflection means 170a is sputtered, sputtered particles do not affect the composition of the film. However, in a facing-targets-type sputtering process, because of the nature of magnetic flux generated via the electron reflection means 170a, the electron reflection means 170a remains virtually unsputtered. Thus, no particular limitation is imposed on material for the electron reflection means 170a. The electron reflection means 170a may have an electric potential which reflects approaching electrons, and in the present embodiment the electron reflection means 170a has the same electric potential as that of the target 110a. The thus-configured target unit 100a and the target unit 100b—in which magnetic poles of the permanent magnets 130a of the magnetic field generation means are reversed with those of the target unit 100a—are disposed in the sputtering apparatus of FIG. 2A.

The sputtering apparatus of FIG. 2A operates in the following manner. After the vacuum chamber 10 is evacuated through an evacuation port 30 by use of an evacuation system, sputtering gas, such as argon, is introduced into the vacuum chamber 10 through an introduction port 40 by use of gas introduction means. The power unit 12 including the DC power supply 50 and the high-frequency power supply 14 supplies sputtering power containing only a DC component or both DC and AC components such that the vacuum chamber 10 serves as an anode (ground) while the targets 110a and 100b serve as cathodes. As a result, sputtering plasma is generated and confined within a confinement space 120 by means of a magnetic field generated by the permanent magnets 130a and 130b of the magnetic field generation means. The ionized sputtering gas in the sputtering plasma sputters the targets 110a and 110b, thereby forming on the substrate 20 a film having a composition corresponding to that of the targets 110a and 110b.

In the sputtering apparatus, since the electron reflection means 170a having the same electric potential as that of the target 110a reflects approaching electrons back into the confinement space 120 so as to trap the electrons within the confinement space 120, high-density plasma is generated. Furthermore, the electron reflection means 170a serves as a magnetic pole end of the magnetic field generation means, thereby generating a magnetic field extending from the electron reflection means 170a to the surface of a peripheral edge portion of the target 110a. As a result, as in the case of a magnetron-type sputtering process, a sputtering region of a magnetron mode is formed at the peripheral edge portion. Thus is implemented a facing-targets-type sputtering process featuring high-rate film formation and high target utilization efficiency.

Second Embodiment

Figure 3:
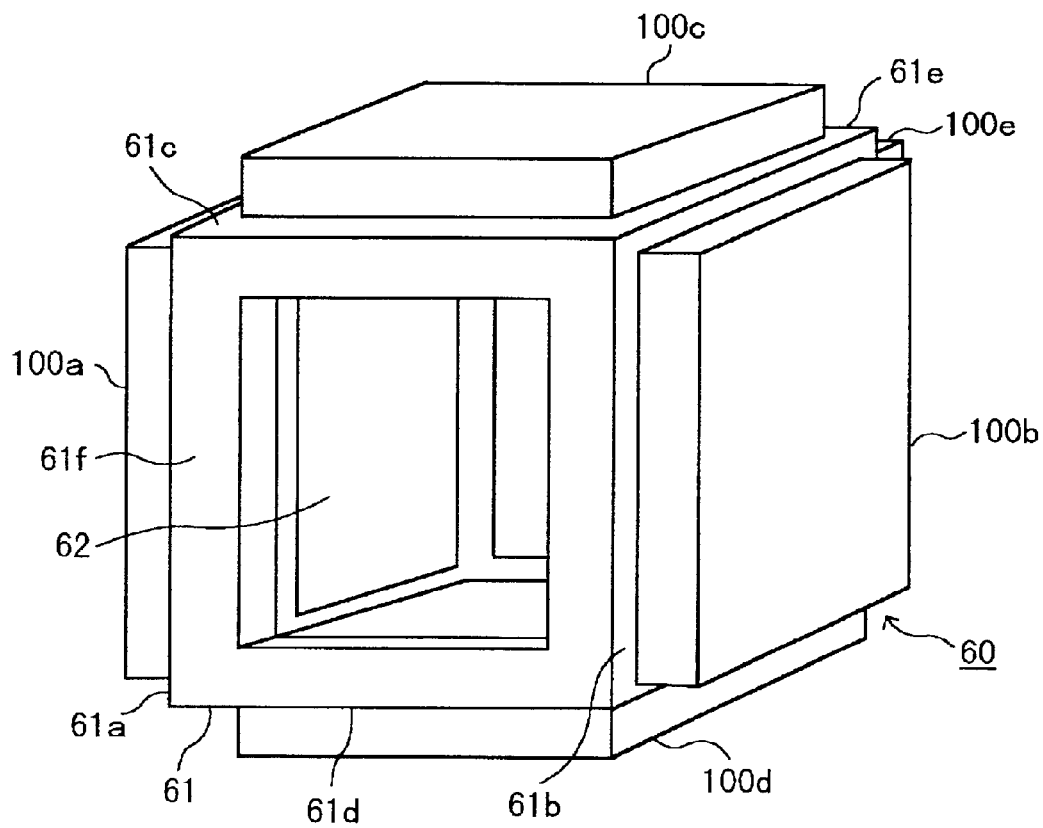
FIG. 3 is a perspective view showing a box-type sputtering unit of a facing-targets-type sputtering apparatus employed in a second embodiment of the present invention.
Figure 4:
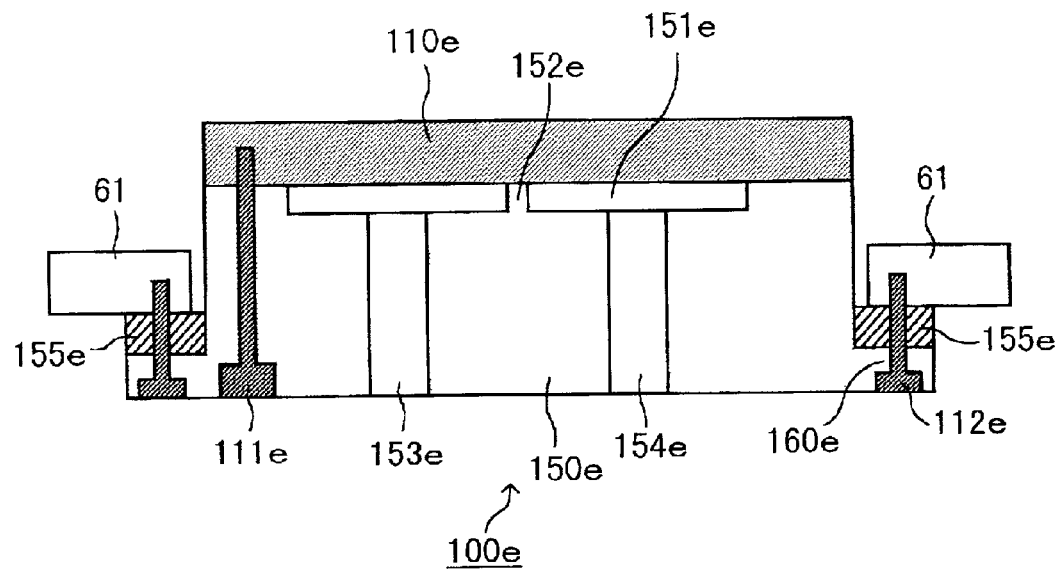
FIG. 4 is a vertical sectional view showing a target unit attached to the back side of the box-type sputtering unit shown in FIG. 3.

A facing-targets-type sputtering apparatus according to a second embodiment of the present invention is configured in the following manner. A box-type sputtering unit similar to that disclosed in aforementioned Japanese Laid-open Patent Publication (kokai) Nos. H10-8246 and H10-330936 is mounted on a wall of a vacuum chamber while a substrate faces an opening of the sputtering unit. FIG. 3 is a perspective view showing a box-type sputtering unit used in the facing-targets-type sputtering apparatus of the present embodiment. FIG. 4 is a vertical sectional view showing a target unit disposed at sides different from those of a pair of facing target units used in the box-type sputtering unit. A DC—high-frequency power supply which supplies power having a DC component and a high-frequency component is employed as a sputtering power supply.

The box-type sputtering unit 60 of the facing-targets-type sputtering apparatus is configured as shown in FIG. 3. Specifically, the box-type sputtering unit 60 includes a support frame 61 assuming the shape of a rectangular parallelepiped. Faces 61a to 61e of the support frame 61 are tightly covered as described below, whereas a face 61f has an opening 62 formed therein. In FIG. 3, the target unit 100a of FIG. 2B and the target unit 100b—in which magnetic poles of the permanent magnets 130a are reversed with those of the target unit 100a—are attached to the faces 61a and 61b at the left and right, respectively, of the opening 62, thereby tightly covering the faces 61a and 61b and establishing the facing-targets arrangement (that is, the target unit 100a of FIG. 2B is attached to the support frame 61 in place of the chamber wall 11). The faces 61c and 61d located above and below, respectively, of the opening 62 are tightly covered with plate-like shield units 100c and 100d. In FIG. 3, the face 61e located on the far side of the page is tightly covered with a target unit 100e not having the magnetic field generation means and electron reflection means, as shown in FIG. 4. Thus is established a box-type configuration in which only the side face 61f is open. Sputtering gas introduction ports (not shown) are provided in the side face 61e, at appropriate intervals, around the target unit 100e, so as to supply sputtering gas directly into the interior space of the sputtering unit 60.

As will be apparent from FIG. 4, the target unit 100e is similar to the target unit 100a of FIG. 2B except that the permanent magnet 130a serving as magnetic field generation means, the magnet housing section 131a, and the electron reflection means 170a are not provided. Features of the target unit 100e are denoted by common reference numerals, and their repeated description is omitted (notably, a subscript indicative of the position of a target unit is changed from letter a to letter e).

Formation of a magnetic field for generating and confining sputtering plasma within the box-type sputtering unit 60 of FIG. 3 is basically similar to that disclosed in aforementioned Japanese Laid-open Patent Publication (kokai) No. H10-8246. Specifically, a parallel magnetic field having a portion parallel to the surface of the target effects generation of a magnetron-mode electromagnetic field in the vicinity of the surface over the entire periphery of each of the facing targets 110a and 110b. Also, a magnetic field extending between the facing targets 110a and 110b causes facing-mode electromagnetic fields within the space between the facing targets 110a and 110b. As a result, high-density plasma is generated over the entire surface of each of the targets 110a and 110b. In the case of the target unit 100e, which has a target but does not have magnetic field generation means, since magnetic flux distribution induced by the magnetic field extending from one target to the other between the target units 100a and 100b is present adjacent to the target surface thereof, a mirror-type magnetron-mode magnetic field is generated in the vicinity of the target surface of the target unit 100e. As a result, high-density sputtering plasma is generated above the target surface.

The shield units 100c and 100d are attached to the support frame 61 to thereby be electrically connected to an anode; i.e., the vacuum chamber. Thus, the shield units 100c and 100d are substantially uninvolved in sputtering and merely serve as shields against sputtered particles.

The thus-configured box-type sputtering unit 60 is attached to a wall of the vacuum chamber such that the opening 62 opens to the interior of the vacuum chamber. Also, substrate holding means is disposed within the vacuum chamber so as to hold a substrate in opposition to the opening 62 with a predetermined distance established therebetween. An evacuation port is provided on a vacuum chamber wall located behind the substrate holding means. The power unit 12 is connected to the sputtering unit 60 and the vacuum chamber such that the grounded vacuum chamber serves as an anode while the target units 100a, 100b, and 100e serve as cathodes in a manner similar to that shown in FIG. 2A.

The apparatus of the second embodiment can form a film in a manner similar to that in the case of the apparatus of the first embodiment. Specifically, after the vacuum chamber is evacuated through an evacuation port by use of an evacuation system, sputtering gas, such as argon, is introduced into the vacuum chamber through the introduction ports located around the target unit 100e, by use of gas introduction means. The sputtering power supply supplies sputtering power containing only a DC component or both DC and AC components such that the vacuum chamber serves as an anode while the targets 110a, 110b, and 110e serve as cathodes. As a result, sputtering plasma is generated and confined within an internal space of the sputtering unit 60 by means of a magnetic field generated by the permanent magnets 130a and 130b of the magnetic field generation means. The sputtering plasma effects sputtering of the targets 110a, 110b, and 110e. Sputtered particles are transferred via the opening 62 to the lower-pressure vacuum chamber, which is evacuated from behind the substrate. As a result, a film having a composition corresponding to that of the targets 110a, 110b, and 110e is formed on the substrate facing the opening 62.

In the sputtering apparatus, since the electron reflection means 170a having the same electric potential as that of the target 110a reflects approaching electrons back into the confinement space 120 so as to trap the electrons within the confinement space 120, high-density plasma is generated. Furthermore, the electron reflection means 170a serves as a magnetic pole end of the magnetic field generation means, thereby generating a parallel magnetic field extending from the electron reflection means 170a to the surface of a peripheral edge portion of the target 110a. As a result, as in the case of a magnetron-type sputtering process, a sputtering region of a magnetron mode is formed at the peripheral edge portion. Thus is implemented a facing-targets-type sputtering apparatus featuring high-rate film formation and high target utilization efficiency. Since high-density plasma is generated by means of the electron reflection means and the parallel magnetic field, discharge voltage can be reduced. In addition, the number of particles such as electrons approaching the substrate is reduced, thereby enabling formation of an excellent electrode.

Furthermore, since the confinement space is closed except for an opening thereof, the efficiency of deposition on a substrate is improved. Since particles are temporarily confined within the confinement space, uniformity in speed and directivity of particles is improved. Furthermore, since the vacuum chamber may house only the substrate holding means, the vacuum chamber can be greatly reduced in size. As a result, the apparatus becomes compact and evacuation time is greatly shortened. Thus, the facing-targets-type sputtering apparatus of the second embodiment yields excellent effects that cannot be yielded by a conventional laterally-opened facing-targets-type sputtering apparatus.

The box-type sputtering apparatus is employed in the below-described Experiments, from the viewpoints of productivity and production cost; i.e., high-rate film formation and high target utilization efficiency. However, no particular limitation is imposed on the facing-targets-type sputtering apparatus employed in the present invention, so long as the apparatus includes electron reflection means such that, in addition to a facing-mode magnetic field perpendicular to a target, a magnetron-mode magnetic field having a portion parallel to the target can be generated at a peripheral edge portion of the target. Therefore, as is apparent from the aforementioned effects, the laterally-opened apparatus shown in FIG. 2A may be employed.

An organic EL device—which is a typical example of organic thin-film devices—employed in the below-described Experiments will next be described. No particular limitation is imposed on the organic EL device to which the present invention can be applied, so long as the device has a structure including a functional organic layer such as an electron-injection layer, and a thin-film layer such as an electrode or an inorganic protective film formed on the organic layer. Therefore, the present invention is not limited to the below-described organic EL device.

Figure 5:
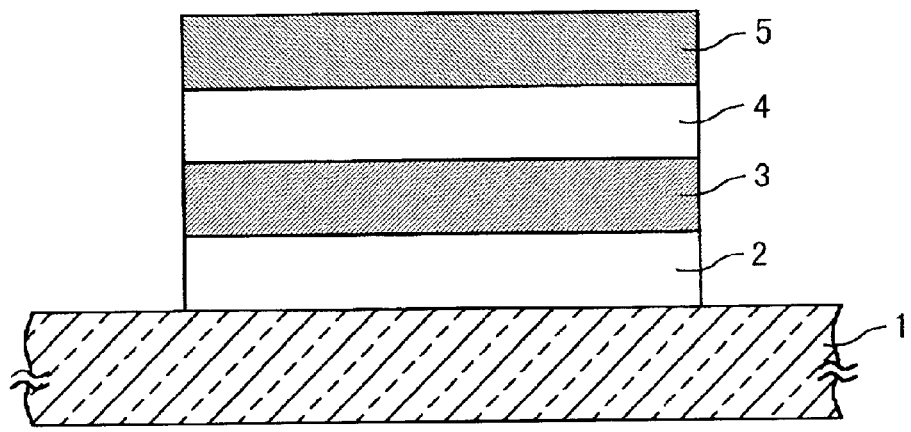
FIG. 5 is an explanatory view showing the structure of an organic EL device employed in Reference Experiment, Experiment 1, and Comparative Experiments 1 and 2.

FIG. 5 is a sectional view showing the structure of a typical organic EL device employed in Experiment 1 and Comparative Experiments. The organic EL device includes a transparent substrate 1 formed from, for example, glass; a positive electrode 2 formed of a transparent conductive layer; a hole-transporting layer 3 formed of an organic compound having hole-transporting property; a light-emitting layer 4 formed of an organic compound having electron-transporting and light-emitting properties; and a negative electrode 5, the electrode 2 to the electrode 5 being successively formed on the substrate 1. In Experiment 1, the negative electrode 5 is formed by means of the method of the present invention.

No particular limitation is imposed on the organic EL device to which the present invention can be applied, so tong as the device has a structure such that an electrode is formed on an organic layer. Therefore, the present invention can be applied to, in addition to the aforementioned example EL device, organic EL devices having known structures. Specific examples of the known organic EL devices include an organic EL device having a structure of transparent substrate/positive electrode/bipolar light-emitting layer/negative electrode, an organic EL device having a structure of transparent substrate/positive electrode/hole-transporting light-emitting layer/electron-transporting layer/negative electrode, an organic EL device having a structure of transparent substrate/positive electrode/hole-transporting layer/light-emitting layer/electron-transporting layer/negative electrode, and an organic EL device having a structure of transparent substrate/positive electrode/hole-transporting light-emitting layer/carrier-block layer/electron-transporting light-emitting layer/negative electrode. In addition to the above examples, one of the present inventors has disclosed in Japanese Laid-open Patent Publication (kokai) No. H10-270171 an organic EL device including a negative electrode and a metal-doped organic layer formed of an organic compound layer doped with a metal serving as an electron donor, the organic layer being provided between the electrode and an organic layer such as a light-emitting layer or an electron-transporting layer. Examples of the organic compound include the below-described organic compounds employed in the light-emitting layer and electron-transporting layer. Examples of the metal include alkaline metals such as Li, alkaline earth metals such as Mg, and transition metals such as rare earth metals, which can reduce the organic compound.

The above structures of the organic EL devices are described in the aforementioned Japanese Laid-open Patent Publication (kokai) Nos. H08-250284, H10-255987, and H10-270171, and many other structures are conventionally known. The present invention can be applied to such organic EL devices.

The transparent substrate 1 is preferably a substrate which transmits as much visible light as possible. Specific examples of the substrate include the aforementioned glass substrate, a transparent plastic substrate, and a quartz substrate.

When light is obtained through the positive electrode, the positive electrode 2 is generally formed of a transparent film containing a metal, alloy, or conductive oxide having high work function. Examples of the transparent film include a thin film formed from a metal such as Au or Pt, and a thin film formed from a metal oxide such as indium-tin oxide (ITO), $SnO_2$, or ZnO. The positive electrode 2 is formed on the substrate by means of vapor deposition or sputtering. The positive electrode 2 preferably transmits as much light from the light-emitting layer as possible. The sheet resistance of the positive electrode 2 is preferably 100 Ω/square or less, and the thickness typically varies from 10 nm to 1 μm.

The negative electrode 5 is generally formed from a metal, alloy, or metal oxide having low work function. Specific examples of the material of the electrode 5 include alkaline metals such as Li, alkaline earth metals such as Mg and Ca, rare earth metals such as Eu, and alloys consisting of the above metals and other metals such as Al, Ag, and In. As disclosed in Japanese Laid-open Patent Publication (kokai) No. H10-270171, when the metal-doped organic layer is provided between the negative electrode and an organic layer such as a light-emitting layer, the properties of the electrode material, such as work function, are not necessarily taken into consideration, so long as the electrode material has conductivity. The negative electrode is formed by means of the method of the present invention. The sheet resistance and thickness of the negative electrode are similar to those of the positive electrode.

The organic EL device may have a structure such that, instead of the positive electrode, the negative electrode is formed of a transparent conductive film, thereby obtaining light through the transparent negative electrode. Alternatively, the organic EL device may have a structure such that both the positive electrode and the negative electrode are formed of a transparent conductive film, thereby obtaining light through both the electrodes. Particularly, a transparent organic EL device including positive and negative electrodes formed of a transparent conductive film—so as to make the whole body transparent—has become of interest as a full-color device which realizes display on both surfaces, and is expected to find practical application. Therefore, there has been demand for a method for producing the transparent organic EL device reliably and at high productivity.

Specific examples of the material of the light-emitting layer 4 include tris(8-quinolinolato) aluminum, which is employed in Experiments; 8-hydroxyquinoline aluminum complexes ($Alq_3$); bis(benzoquinolinolato) beryllium (BeBq); and π-conjugated polymers such as polyparaphenylene vinylene and polyalkylthiophene.

Specific examples of the material of the hole-transporting layer 3 include αNPD, which is employed in Experiments; polysilanes such as poly(methylphenylsilane); polyvinylcarbazole; and N,N'-diphenyl-N,N'-bis(3-methylphenyl)-1,1'-biphenyl-4,4'-diamine (TPD).

Specific examples of the material of the electron-transporting layer include the aforementioned $Alq_3$ and 2-(4'-tert-butylphenyl)-5-(phenyl)-1,3,4-oxadiazole.

In the present invention, the materials of the layers are not limited to the aforementioned known materials.

The present invention will next be described by way of Experiments, Reference Experiment, and Comparative Experiments.

Experiments

In Reference Experiment, Experiment 1, and Comparative Experiments 1 and 2, organic EL devices of identical structure were produced. The negative electrodes of the respective devices were produced by means of different methods, and the devices were compared with one another in terms of properties.

The following apparatuses were employed for production of the devices. A thermal evaporation apparatus (model: VPC-400, product of Shinku-kiko) was employed for vapor deposition of organic compounds and metals. FTS R-2LS (product of Osaka Vacuum, Ltd.) was employed as a conventional facing-targets-type sputtering apparatus. The aforementioned facing-targets-type sputtering apparatus including the box-type sputtering unit was employed as the sputtering apparatus of the present invention.

The thickness of a film was measured by use of a P10 stylus-contact profiloemeter (product of Tencor). Properties of the devices were evaluated by use of SOURCE METER 2400 (product of KEITHLEY) and BM-8 luminance meter (product of TOPCON). The luminance and current of the devices were measured in the following manner. DC voltage was applied to positive and negative electrodes in a step-like manner at a rate of 1 V/two seconds (in Reference Experiment, Experiment 1, and Comparative Experiments 1 and 2) and at a rate of 0.2 V/two seconds (in Experiment 2), and the luminance and current were measured one second after the voltage was increased.

Reference Experiment

In Reference Experiment, an organic EL device sample having the structure shown in FIG. 5 was fabricated as follows. A commercially available glass substrate coated with indium-tin oxide (ITO) (product of Sanyo vacuum), having a sheet resistance of 20 Ω/square, was employed as a substrate 1. The ITO coated on the substrate was used as a positive electrode 2. On the ITO positive electrode 2 were formed a hole-transporting layer 3, a light-emitting layer 4, and a negative electrode 5 successively by use of the aforementioned thermal evaporation apparatus, to thereby produce a reference sample.

The hole-transporting layer 3 (thickness: 500 Å) was formed from αNPD having hole-transporting property and being represented by the following formula (1) at $1.3 \times 10^{-4}$ Pa and at a deposition rate of 2 Å/second.

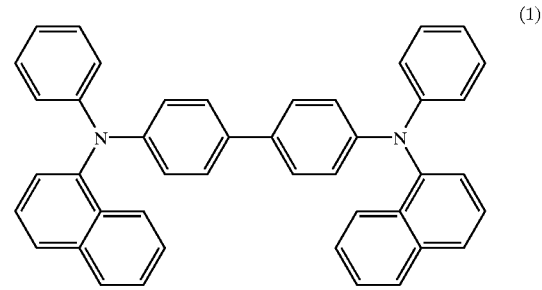

(1)

The light-emitting layer 4 (thickness: 700 Å) was formed from tris(8-quinolinolato) aluminum (hereinafter referred to as "Alq"), which emits green light and is represented by the following formula (2), through thermal evaporation under the same conditions as those employed in the case of the hole-transporting layer 3.

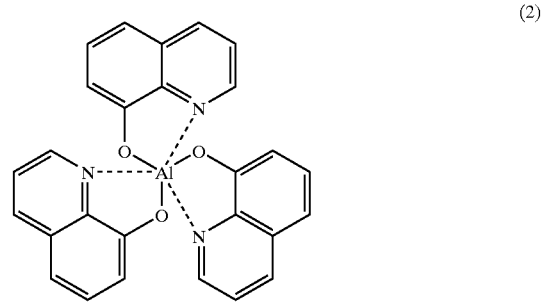

(2)

The negative electrode 5 (thickness: 1,000 Å) was formed from Al through thermal evaporation method at a deposition rate of 10 Å/second. The reference sample had a square emission region (width: 0.5 cm, length: 0.5 cm).

Figure 6:
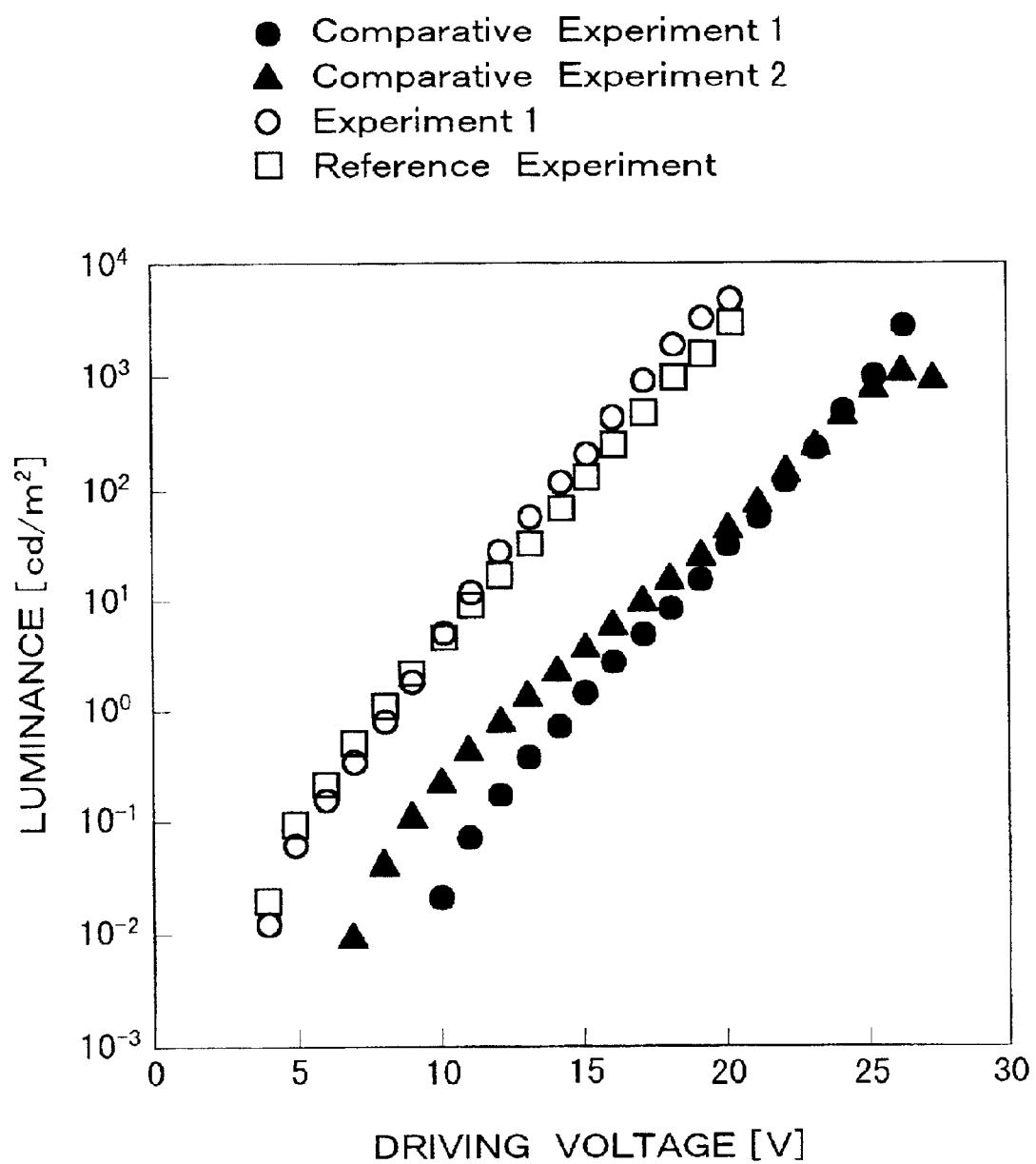
FIG. 6 is a graph showing the results of measurement of luminance-voltage properties of samples of Experiment 1, Reference Experiment, and Comparative Experiments 1 and 2.
Figure 7:
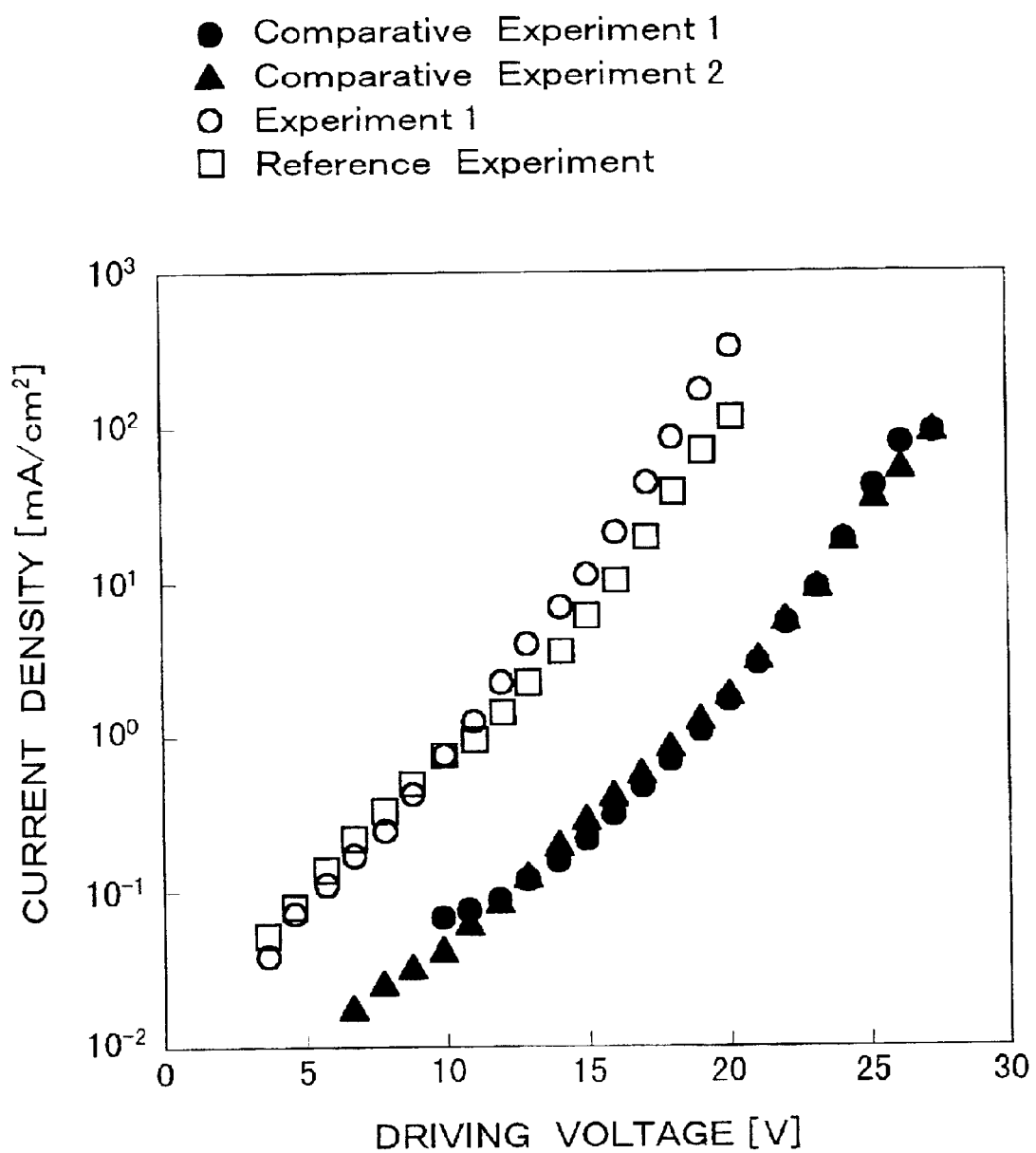
FIG. 7 is a graph showing the results of measurement of current density-voltage properties of samples of Experiment 1, Reference Experiment, and Comparative Experiments 1 and 2.

DC voltage was applied to the positive electrode 2 and the negative electrode 5 of the reference sample, to thereby measure the current density and the luminance of green light emitted from the light-emitting layer 4. The results are shown in FIGS. 6 and 7. In FIGS. 6 and 7, the results of the reference sample are represented by open square plots. FIGS. 6 and 7 show the luminance-voltage and current density-voltage characteristic curves of the sample, respectively. As shown in these figures, in the reference sample, obtaining luminance of 100 $cd/m^2$ requires application of 15 V, and obtaining luminance of 1,000 $cd/m^2$ requires application of 18 V. When a voltage of 20 V is applied, the luminance becomes maximum (i.e., 2,900 $cd/m^2$), and the current density is 130 $mA/cm^2$.

Experiment 1

In Experiment 1, the procedure of Reference Experiment was repeated, except that a negative electrode 5 was formed by use of the below-described facing-targets-type sputtering apparatus, to thereby produce a sample having the same structure as that of the reference sample.

The negative electrode 5 (thickness: 1,000 Å) was formed from Al by use of the aforementioned facing-targets-type sputtering apparatus including the box-type sputtering unit. The electrode was formed under the following sputtering conditions: pressure 0.21 Pa, supplied power 500 W, discharge voltage 280 V. In Experiment 1, only DC voltage was supplied. The electrode was formed at a film formation rate of 6.7 Å/second.

The measurement results of the sample of Experiment 1 are shown in FIGS. 6 and 7. In FIGS. 6 and 7, the results of the sample are represented by open circle plots. FIGS. 6 and 7 show the luminance-voltage characteristic curve and current density-voltage characteristic curve of the sample, respectively. As shown in these figures, in the sample of Experiment 1, obtaining luminance of 100 $cd/m^2$ requires application of 14 V, and obtaining luminance of 1,000 $cd/m^2$ requires application of 17 V. When a voltage of 20 V is applied, the luminance becomes maximum (i.e., 4,980 $cd/m^2$), and the current density is 300 $mA/cm^2$. As is apparent from the results, the luminance property of the sample of Experiment 1 is similar to or more excellent than that of the reference sample including the negative electrode 5 formed through thermal evaporation method, and the maximum luminance of the sample of Experiment 1 is 1.7 times that of the reference sample.

Comparative Experiment 1

In Comparative Experiment 1, the procedure of Reference Experiment was repeated, except that a negative electrode 5 was formed by use of the below-described facing-targets-type sputtering apparatus, to thereby produce a sample having the same structure as that of the reference sample.

The negative electrode 5 (thickness: 1,000 Å) was formed from Al by use of FTS R-2LS (product of Osaka Vacuum, Ltd.) having the same basic configuration as that of the aforementioned facing-targets-type sputtering apparatus of FIG. 1. The electrode was formed under the following sputtering conditions: pressure 0.5 Pa, supplied power 1 kW, discharge voltage 364 V. The electrode was formed at a film formation rate of 2.8 Å/second.

The measurement results of the sample obtained from Comparative Experiment 1 are shown in FIGS. 6 and 7. In FIGS. 6 and 7, the results of the sample are represented by solid circle plots. FIGS. 6 and 7 show the luminance-voltage property and current density-voltage property of the sample, respectively. As shown in these figures, in the sample of Comparative Experiment 1, obtaining luminance of 100 $cd/m^2$ requires application of 22 V, and obtaining luminance of 1,000 $cd/m^2$ requires application of 25 V. When a voltage of 26 V is applied, the luminance becomes maximum (i.e., 3,000 $cd/m^2$), and the current density is 190 $mA/cm^2$. As is apparent from the results, in order to obtain a certain luminance, a higher voltage must be applied to the sample of Comparative Experiment 1 as compared with the case of the reference sample.

Comparative Experiment 2

In Comparative Experiment 2, the procedure of Reference Experiment was repeated, except that a negative electrode 5 was formed, by use of the same sputtering apparatus employed in Comparative Experiment 1, at a film formation rate lower than that in Comparative Experiment 1 in order to reduce adverse effects on an organic layer, to thereby produce a sample having the same structure as that of the reference sample.

The negative electrode 5 (thickness: 1,000 Å) was formed from Al by use of FTS R-2LS (product of Osaka Vacuum, Ltd.) employed in Comparative Experiment 1. The electrode was formed under the following sputtering conditions: pressure 0.5 Pa, supplied power 0.2 kW, discharge voltage 344 V. The electrode was formed at a film formation rate of 0.56 Å/second.

The measurement results of the sample of Comparative Experiment 2 are shown in FIGS. 6 and 7. In FIGS. 6 and 7, the results of the sample are represented by solid triangle plots. FIGS. 6 and 7 show the luminance-voltage and current density-voltage characteristic curves of the sample, respectively. As shown in these figures, in the sample of Comparative Experiment 2, obtaining luminance of 100 $cd/m^2$ requires application of 22 V. When a voltage of 26 V is applied, the luminance becomes maximum (i.e., 1,100 $cd/m^2$), and the current density is 60 $mA/cm^2$. As is apparent from the results, in order to obtain a certain luminance, a higher voltage must be applied to the sample of Comparative Experiment 2 as compared with the case of the reference sample. Although the negative electrode 5 was formed at a lower deposition rate in order to reduce influence on a light-emitting layer 4 under the electrode, the maximum luminance of the sample of Comparative Experiment 2 was lowered.

The results of Reference Experiment, Experiment 1, and Comparative Experiments 1 and 2 show the following. The results of Comparative Experiment 1 show that, when the negative electrode is formed by use of the conventional facing-targets-type sputtering apparatus, the organic compound is damaged by particles of high energy at the interface between the organic layer and the negative electrode, and the damaged compound may impede injection of electrons from the electrode into the organic layer, to thereby cause a local increase in current density. And that brings about shortening the life of the device. The results of Comparative Experiment 2 show that, even when the negative electrode is formed at a greatly decreased deposition rate in order to reduce influence on the layer under the electrode as much as possible, properties of the organic EL device are not improved.

In contrast, the results of Experiment 1 show that, when the negative electrode is formed by use of the facing-targets-type sputtering apparatus of the present invention including electron reflection means—in which a magnetron-mode magnetic field having a portion parallel to the surface of a facing target is generated, properties of the resultant device are similar to those of the device of Reference Experiment, in which the negative electrode is formed through thermal evaporation method. The results also show that the maximum luminance and current density of the device of Experiment 1 are higher than those of the device of Reference Experiment, and thus the negative electrode has high quality and no defects.

Thus, according to the present invention, a thin-film layer of high quality can be formed on a functional organic layer without deteriorating properties of the organic layer. Therefore, the present invention can be applied to formation of a thin-film layer on a functional organic layer.

Experiment 2

In Experiment 2, a transparent organic EL device which emits light through both its surfaces was produced.

Figure 8:
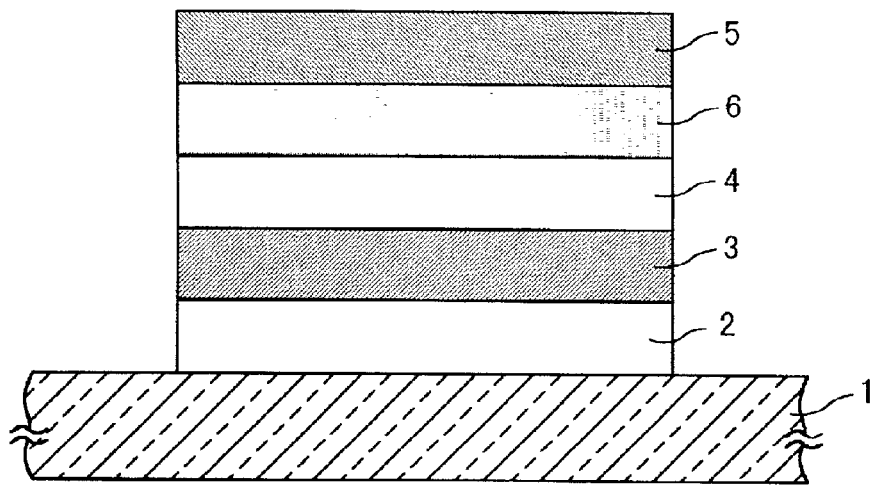
FIG. 8 is an explanatory view showing the structure of an organic EL device of Experiment 2.

A transparent device having the structure shown in FIG. 8 was produced as follows. A transparent substrate 1 to a light emitting layer 4 were formed in a manner similar to that of the reference sample, except that the thickness of the light-emitting layer was changed to 400 Å.

Subsequently, as described below, on the light-emitting layer 4 was formed a metal-doped organic layer 6 of an organic compound doped with a metal serving as an electron donor, the organic layer being disclosed in Japanese Laid-open Patent Publication (kokai) No. H10-270171. Specifically, the organic layer 6 (thickness: 300 Å) was formed from bathocuproine having electron-transporting property and being represented by the following formula (3) and metallic cesium (Cs) (ratio by mol=1:1), through codeposition by use of the aforementioned thermal evaporation apparatus at $1.33 \times 10^{-4}$ Pa and a deposition rate of 2 Å/second.

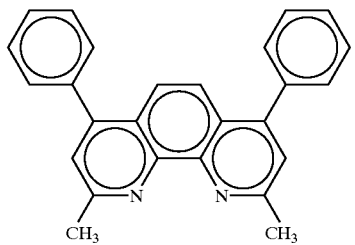

(3)

Evaporation of metallic cesium (Cs) was performed by use of a commercially available alkali metal dispenser (product of Saes Getters)

Subsequently, an ITO transparent conductive film serving as a negative electrode 5 was formed on the metal-doped organic layer 6 in the below-described manner, to thereby produce a transparent organic EL device including the substrate 1 up to the negative electrode 5, all of which are transparent.

The negative electrode 5 (thickness: 1,000 Å) was formed from ITO by use of the aforementioned facing-targets-type sputtering apparatus including the box-type sputtering unit. In Experiment 2, the power unit 12 shown in FIG. 2A was employed as the sputtering power supply of the sputtering apparatus, to thereby supply an AC-DC power containing a DC component and a high-frequency component. ITO was employed as the sputtering target.

The negative electrode was formed under the following sputtering conditions: sputtering gas: argon containing 2 vol % oxygen, pressure: 0.05 Pa, supplied power: AC-DC power containing DC power (250 W) and high-frequency (RF) power (150 W), discharge voltage: 133 V, film formation rate: 4.0 Å/second).

Figure 9:
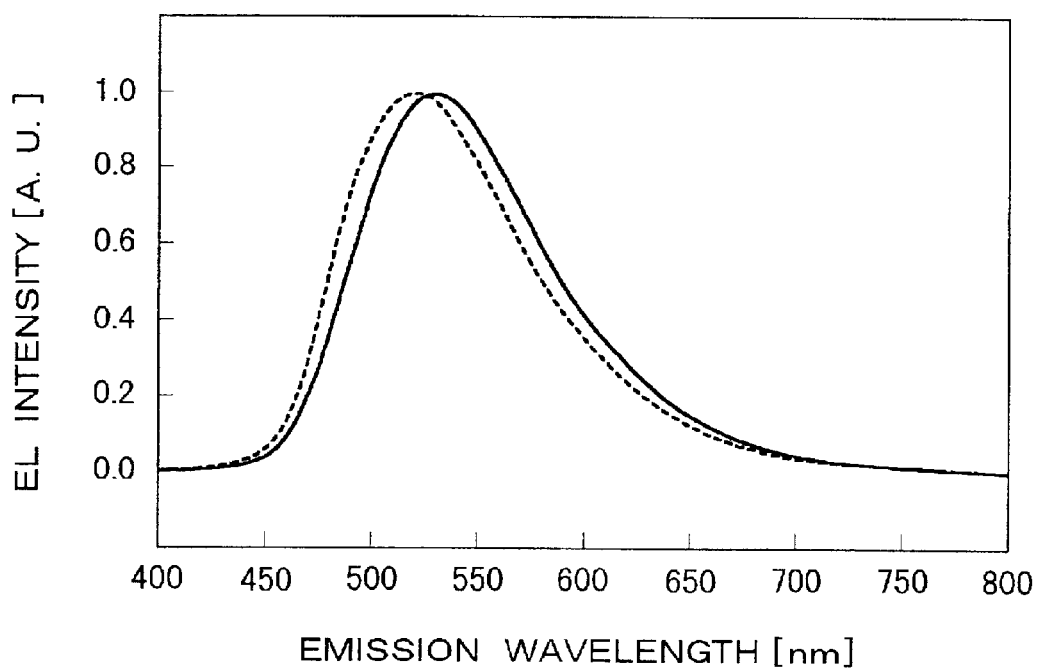
FIG. 9 is a graph showing emission spectra obtained through both surfaces of a sample of Experiment 2.
Figure 10:
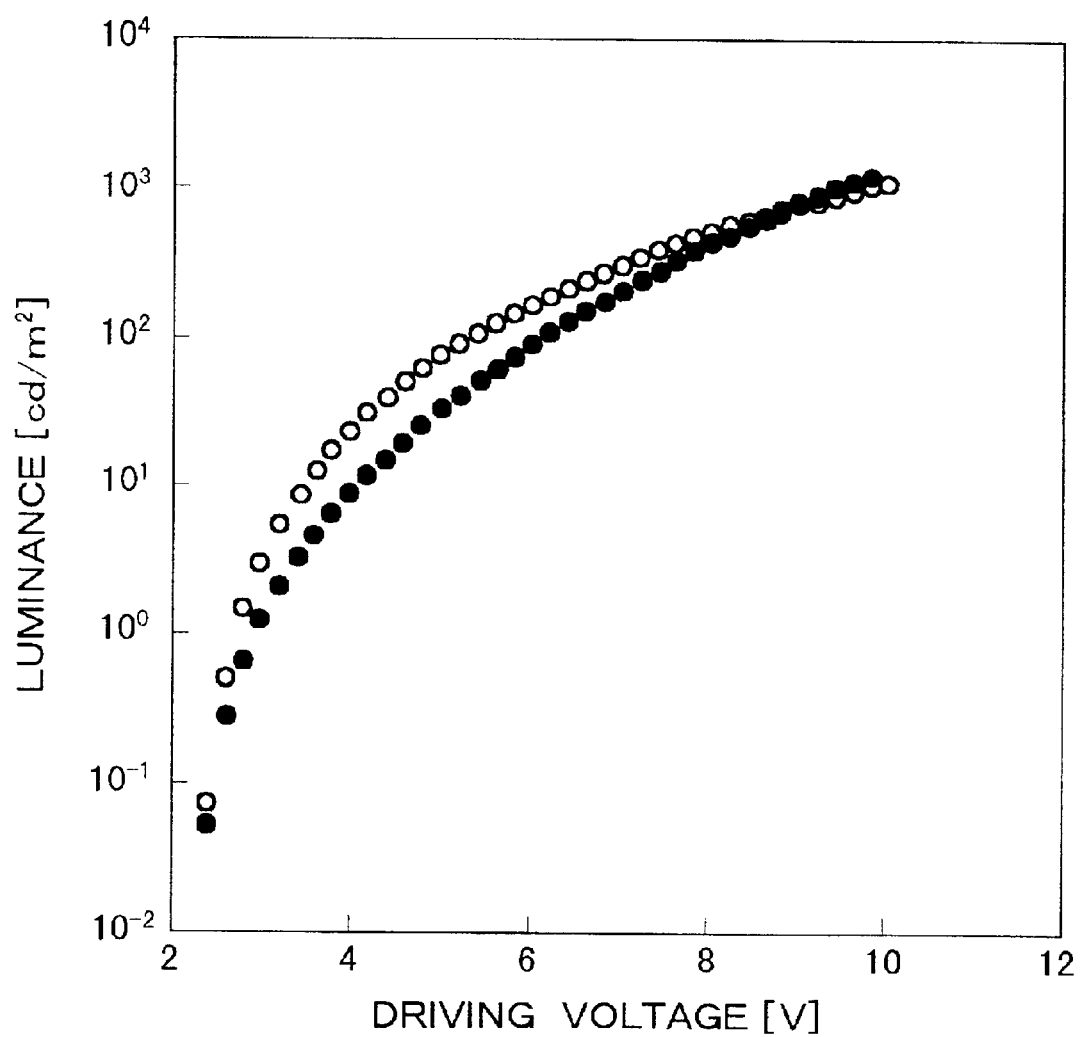
FIG. 10 is a graph showing the results of measurement of luminance-voltage properties of a sample of Experiment 2.

FIGS. 9 and 10 show the results of emission spectra and luminance of the resultant organic EL device (sample), respectively.

In the transparent organic EL device of Experiment 2, green light emitted through the both surfaces of the transparent substrate 1 and the transparent negative electrode 5 was observed. In FIG. 9, the solid line represents the spectrum of light emitted through the surface of the negative electrode 5, and the dotted line represents the spectrum of light emitted through the transparent substrate 1. The emission spectra slightly differ from each other by virtue of the interference effect.

FIG. 10 shows the luminance-voltage characteristics of the sample. In FIG. 10, the characteristic curve obtained when measured through the transparent substrate 1 is represented by open circle plots, and the characteristic curve obtained when measured through the negative electrode 5 is represented by solid circle plots. The voltage applied to the sample when light begins to radiate through each of the transparent substrate 1 and the negative electrode 5 is 2.4 V. At the transparent substrate 1, obtaining luminance of 102 $cd/M^2$ requires application of 5.4 V, and obtaining luminance of 1,006 $cd/m^2$ requires application of 9.8 V. At the negative electrode 5, obtaining luminance of 103 $cd/m^2$ requires application of 6.2 V, and obtaining luminance of 1,074 $cd/m^2$ requires application of 9.6 V.

When the transparent ITO negative electrode 5 is formed on the metal-doped organic layer 6 by means of the method of the present invention, light begins to radiate from the organic EL device through application of a voltage of 2.4 V, which is substantially equal to the voltage corresponding to the band gap (about 2.2 eV) of Alq serving as the material of the light-emitting layer 4. The results show that a property-deteriorating layer is not formed between the organic layer and the negative electrode, and excellent charge injection properties can be obtained. In addition, it is confirmed that the deposition rate of the negative electrode 5 reaches to a practically applicable level.

What is claimed is:

1. A method for producing an organic thin-film device having a structure including a functional organic layer formed from an organic compound and a thin-film layer deposited onto the organic layer, the method comprising:

forming the thin-film layer by use of a facing-targets-type sputtering apparatus including a pair of facing targets disposed a predetermined distance away from each other; an electron reflection electrode disposed at the periphery of each target so as to face a confinement space provided between the paired targets; and magnetic field generation means disposed at the lateral sides of each target, wherein the magnetic field generation means generates a magnetic field extending from one target to the other so as to surround the confinement space, as well as a magnetic field having a portion parallel to the surface of each target in the vicinity of a peripheral edge portion of the target, wherein the thin-film layer is formed at a discharge voltage of 300 V or less.

2. A method for producing an organic thin-film device according to claim 1, wherein the thin-film layer is formed at a gas pressure of 0.3 Pa or less.

3. A method for producing an organic thin-film device according to claim 1, wherein the facing-targets-type sputtering apparatus is a box-type facing-targets-type sputtering apparatus comprising a cubic or rectangular parallelepiped box-type sputtering unit including targets disposed on a pair of facing faces, an opening provided in a face located laterally to the paired faces, and the three remaining faces, which are closed; wherein a member is disposed so as to face the opening and the thin-film layer is formed on the member.

4. A method for producing an organic thin-film device according to claim 1, wherein the thin-film layer is an inorganic layer formed from an inorganic substance.

5. A method for producing an organic thin-film device according to claim 4, wherein the inorganic layer is an electrode formed from a conductive material.

6. A method for producing an organic thin-film device according to claim 4, wherein the inorganic layer is an insulating protective layer formed from an inorganic substance.

7. A method for producing an organic thin-film device according to claim 4, wherein the organic thin-film device is an organic electroluminescent device.

8. A method for producing an organic thin-film device according to claim 7, wherein the functional organic layer is a member selected from the group consisting of a light-emitting layer, an electron-transporting organic layer, an electron-transporting light-emitting layer, and a metal-doped organic layer formed from an organic compound doped with a metal serving as an electron donor, the metal-doped organic layer being provided between a negative electrode and the light-emitting layer, the electron-transporting organic layer, or the electron-transporting light-emitting layer.

9. A method for producing an organic thin-film device according to claim 7, wherein the inorganic layer is an electrode formed from a metallic film or a transparent conductive film.

10. A method for producing an organic thin-film device according to claim 9, wherein the transparent conductive film is an indium-tin oxide film.

11. A method for producing an organic thin-film device according to claim 1, wherein the facing-targets-type sputtering apparatus includes a AC-DC sputtering power supply which supplies power containing a DC component and a high-frequency component.

* * * * *